[19] United States Patent
Hayashi et al.

[11] Patent Number: 4,950,376
[45] Date of Patent: Aug. 21, 1990

[54] METHOD OF GAS REACTION PROCESS CONTROL

[75] Inventors: Yutaka Hayashi; Yasushi Kondo; Kenichi Ishii, all of Tsukaba; Eita Kinoshita, Tsuchiura, all of Japan

[73] Assignees: Agency of Industrial Science & Technology; Ministry of International Trade & Industry, Tokyo, Japan

[21] Appl. No.: 317,201

[22] Filed: Feb. 28, 1989

[30] Foreign Application Priority Data

Jun. 21, 1988 [JP] Japan ................................ 63-153049

[51] Int. Cl.$^5$ .............................................. C23F 4/04
[52] U.S. Cl. ............................ 204/192.32; 156/345; 156/643; 204/298.32; 204/298.34
[58] Field of Search ................. 204/298 EP, 298 MW, 204/192.32; 156/345, 643

[56] References Cited

U.S. PATENT DOCUMENTS 4,158,589  6/1979  Keller et al. .................... 156/345
4,349,409  9/1982  Shibayama et al. ............. 156/643

FOREIGN PATENT DOCUMENTS 100430  6/1983  Japan .
 61316  3/1987  Japan .
154626  7/1987  Japan .

Primary Examiner—G. L. Kaplan
Attorney, Agent, or Firm—Oblon, Spivak, McClelland, Maier & Neustadt

[57] ABSTRACT

A method of gas reaction process control in which plasma gas generated in a location different than a location at which a specimen is held is transported to a location at which the specimen is held and gas processing of the specimen is carried out. A control electrode with porous structure permeable to the plasma gas is provided in the transportation route and a voltage is applied to the control electrode voltage for adjusting the specimen surface potential so as to prevent degradation of the specimen due to specimen surface potential.

9 Claims, 7 Drawing Sheets

METHOD OF GAS REACTION PROCESS CONTROL

BACKGROUND OF THE INVENTION

1. Field of the Invention

This invention relates to a method of gas reaction process control for carrying out various gas reaction processes including etching of semiconductor substrates, various thin films and other specimens, as well as oxidation and nitridation.

2. Prior Art Statement

The devices often used when conventionally carrying out dry etching of semiconductor specimens include plasma etching devices and reactive ion etching (RIE) devices, for example.

Yet in these devices, etching is carried out by applying a high-frequency voltage across a pair of parallel plate electrodes facing each other in a vacuum chamber, so that a specimen attached in advance to the surface of one of the electrodes is directly exposed to the plasma thus generated. Thus the ions in the plasma collide with the surface of the specimen at high energies, often causing damage.

To remedy this situation and eliminate these types of defects, plasma etching devices using ECR (electron cyclotron resonance) ion sources have been proposed. (For example, Japanese Pat. Public Disclosure No. 59-127832.)

In these devices, microwaves and a static magnetic field are applied to low-pressure gas in a plasma generation section provided at a location separate from where the specimen to be processed is held. By causing the electrons in the plasma thus generated to undergo cyclotron motion, the ionization rate within the plasma is increased. Once a high-density, long-lived plasma is generated, it is transported to the location at which the specimen is held, and the etching process is carried out there.

Using such ECR-type plasma etching devices, because the specimen is not located in the environment of plasma generation, the problem of damage to the specimen surface from direct ion collisions is solved.

However, instead, particularly when there is a thin insulating film on the surface of the specimen, there occurs a phenomenon which causes degradation of this insulating film.

The inventors of this invention studied the causes of this phenomenon in an effort to remedy this situation. As a result, they found that the ions and electrons and such in the plasma gas were accumulating on the surface of the specimen, creating a large difference in electric potential between the front and back surfaces of the specimen, and that the deterioration of the thin insulating film was due to this difference in electric potential.

In addition, as a result of obtaining this knowledge, it was found that this problem with specimen surface potential is not limited to ECR-type devices as described above, but rather is a problem common to all devices which carry out some kind of gas reaction processing such as etching as described above, as well as oxidation, nitridation and other processes accomplished by generating plasma gas at a location separate from where the specimen is held, and selectively transporting the dissociated ions, electrons or radicals (free radicals: excited atoms or molecules) to the surface of the specimen.

OBJECT AND SUMMARY OF THE INVENTION

This invention was accomplished in light of the above, and its object is to provide a technique for controlling the electric potential on the surface of a specimen when plasma gas is generated in a location different than that where a specimen is held and transported to where the specimen is held whereat etching, oxidation, nitridation or other gas reaction processing is carried out, in order to prevent the surface potential from reaching an unfavorable value and causing degradation of insulating film on the specimen.

In order to achieve the object described above, in this invention, a control electrode having a porous structure permeable to the generated plasma is provided between the location at which the specimen is held and the plasma generation section provided at a location different from the location at which the specimen is held. By controlling the voltage applied to this electrode, the electric potential of the surface of the specimen can be adjusted.

As described above, if the same electric potential as that of the rear surface of the specimen is applied to the control electrode with the porous structure, any difference in electric potential between the front and rear surfaces of the specimen will be eliminated or be reduced to a level which causes no problem, preventing degradation of insulating film on the specimen.

The above and other features of the present invention will become apparent from the following description made with reference to the drawings.

DETAILED DESCRIPTION OF THE PREFERRED EMBODIMENTS

Figure 1:
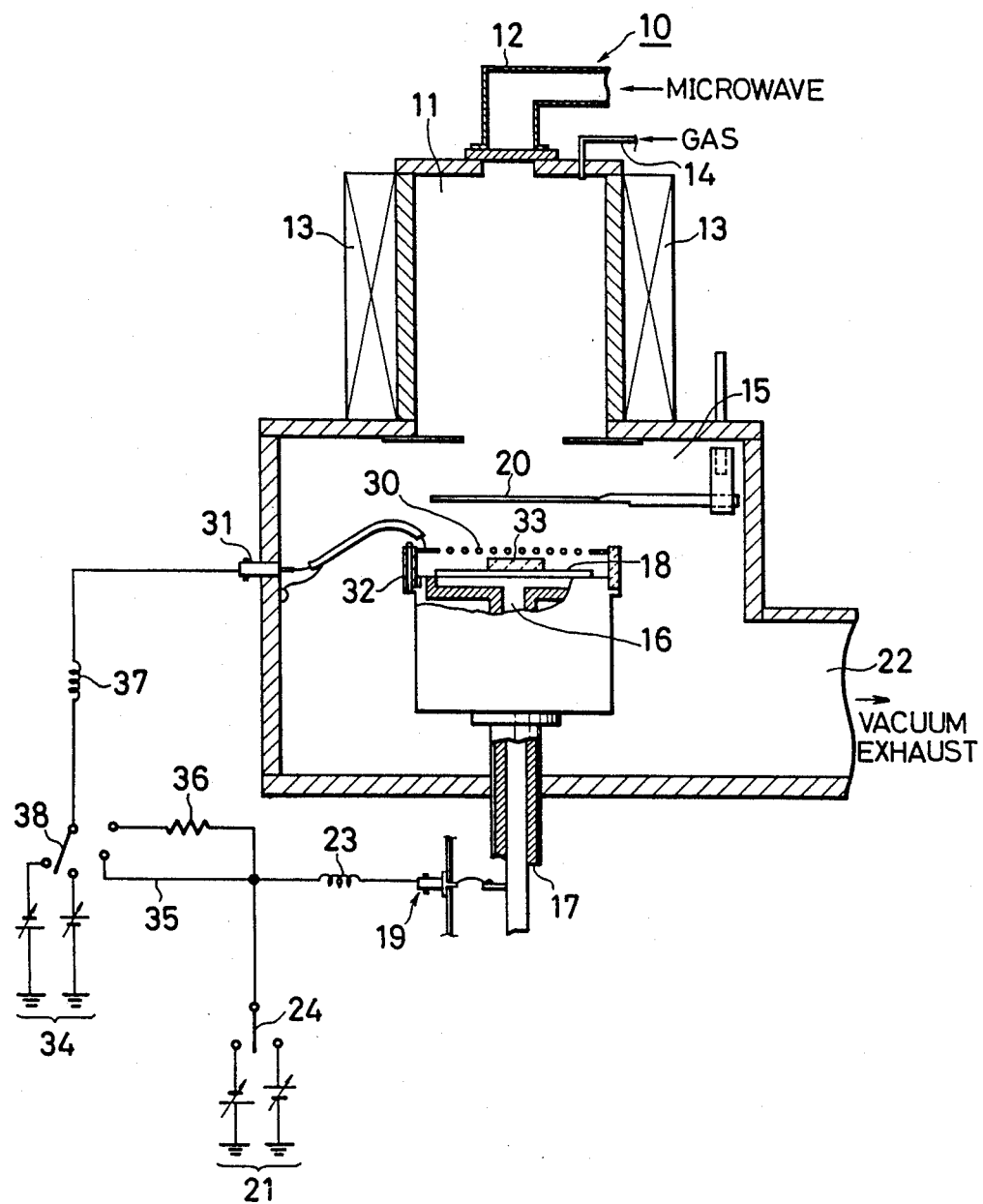
FIG. 1 is a schematic diagram illustrating this invention as applied to a gas reaction processing device having an ECR-type plasma generation section.

In order to prevent the degradation of the insulating film on specimens which occur in ECR-type plasma etching devices, the method according to this invention provides a control electrode having a porous structure which is permeable to the generated plasma between the location at which the specimen is held and the plasma generation section provided at a location different from where the specimen is held. The electric potential of the surface of the specimen is adjusted by controlling the direct current voltage applied to this electrode.

Herein, plasma gas is defined to include, as previously described, not only a gas comprised only of dissociated ions (essentially plasma), but also, as is typical in this type of plasma processing device, a gas which also includes electrons, excited atoms and/or the excited molecules known as radicals or alternately free radicals.

Therefore, as to the porous structure of the control electrode used in this electrode, so long as the specified amount of plasma gas can permeate through to the specimen surface, its specific structure does not matter, but for example, a mesh made of woven conductive wire, or a structure in which many circular holes or long, thin slits are cut in a conductive plate or other like structures are easy to fabricate and easy to use.

The location at which this control electrode is to be provided lies between the plasma generation section and the location at which the specimen is held. The reason for this is that if the control electrode is too close to the plasma generation section, damage to the control electrode is appreciable. Yet if the control electrode is too close to the specimen, the pattern of holes on the control electrode will be transferred to the specimen, so the control electrode must be placed at an appropriate distance away from the specimen.

In addition, in order to adjust the specimen surface potential to the optimum value, the voltage applied to this control electrode will be an appropriate value, sometimes positive, sometimes negative, and naturally, as a result, it may also be zero.

That is to say, from a standpoint of general use, it is desirable to be able to change, to a certain degree, the voltage applied to the control electrode. To this end, the preparation of a dedicated variable bias power source for the control electrode which can switch between positive and negative voltage is simple and convenient. However, in a case where only specimens of a specified material are processed and the processing conditions which influence the processing of the specimen are fixed, this power source may of course be replaced with a fixed-bias power source set at the appropriate output voltage value. Or it may be sufficient to provide a specimen holder which both physically supports the rear surface of the specimen and also provides the specified electric potential by being in electrical contact with the rear surface of the specimen, and simply connect it to the control electrode in a short-circuit manner using conducting lines, resistance lines or other conductive means. In other words, the specimen holder potential, which is equal to the specimen rear surface potential itself, would apply the specified direct current voltage to the control electrode.

The most appropriate method of determining the value of the control electrode voltage needed to eliminate any difference in electric potential between the front and rear surfaces of the specimen is the method of using an amplifier to feed the difference in electric potential between the front and rear surfaces of the specimen, or of a monitoring specimen placed near the specimen, back to the control electrode. Thus the difference in electric potential between the front and back surfaces of the specimen can be automatically brought to nearly zero.

Yet in the event one wishes intentionally to provide an appropriate difference in electric potential between the front and rear surfaces of the specimen, or to prevent degradation of the specimen to an optimal degree, or if there is another desirable effect, an additional voltage could be applied to the control electrode.

With this invention, in a gas reaction processing device in which a plasma gas containing dissociated ions, dissociated ions and radicals, or electrons and radicals is transported from the plasma generation section provided in a location different than where the specimen is held to where the specimen is held, the electric potential of the specimen front surface can be set to an appropriate value independently from the rear surface.

Therefore, in contrast to the accumulation of ions or electrons on the specimen surface which accompanies plasma generation and leads to deterioration of the characteristics of the surface of the specimen in conventional types of these gas reaction processing devices, by means of the method of this invention, the surface potential can be intentionally adjusted at will depending on the potential applied to the control electrode, so the surface potential can be forcibly kept within the range over which such a problem does not occur.

While this repeats what was already described above, bringing the difference in electric potential between the front and rear surfaces of the specimen to zero is typically most effective in preventing degradation of the specimen, and therefore, giving the control electrode used in this invention an electric potential which brings the difference in electric potential between the front and rear surfaces of the specimen to zero is the most typical method of usage.

With this invention, because of the capability of adjustment or arbitrary setting of the surface potential of the specimen during gas reaction processing, its range of application is extremely wide. Even in plasma transport device systems in which direct ion damage is low, specimen degradation which occurs due to specimen front surface potential can be effectively suppressed. Therefore, this invention can lead to improvements in characteristics of various electronic circuits which can be fabricated from such specimens having little or no degradation.

In particular, looking into the future, as various insulated-gate devices and such used in LSIs and such become smaller, the gate insulating films in the devices will tend to become even thinner. Thus, in contrast to the increasing probability of degradation of these thin insulating films when using the conventional dry processing method without modification, if this invention is employed, this danger can be averted. In this sense, this invention is extremely useful.

FIG. 1 illustrates this invention as applied to a plasma etching device using an ECR-type plasma source. A plasma chamber 11 is used as the plasma generation section. Into this chamber 11 are sent microwaves via a waveguide 12 and, via a gas inlet pipe 14, the gas to be converted to plasma.

In addition, a magnet coil 13 which generates a static magnetic field within the chamber is provided on the outside of the plasma chamber 11. When the microwaves sent via the waveguide 12 and a direct current magnetic field generated by the magnet coil 13 at above the critical magnetic field strength required to create the ECR phenomenon are applied to the low-pressure gas introduced into the plasma chamber 11, electrons in the plasma generated within the plasma chamber will begin cyclotron motion and contribute to the ionization rate within the plasma, resulting in a high-density, long-lived plasma.

The bottom of the plasma chamber 11 is open, leading to a vacuum chamber or gas reaction processing chamber 15.

Inside this gas reaction processing chamber 15, is provided an electrode 16 which is insulated and surrounded by insulation 17; these together comprise a specimen holder 18 onto the surface of which the specimen to be processed 33 is placed.

Therefore, the electric potential of the rear surface of specimen 33 is the same electric potential provided to the specimen holder electrode 16. This specimen holder electrode 16 can be connected to an external power source 21 by the specimen holder electrode terminal 19. This external power source 21 is shown in the figure as the pair of positive/negative variable direct current power sources 21, which are symbolically represented such that the power source can take an arbitrary positive or negative value (including 0 volts or ground) when the switch 24 selects one or the other.

Also, if necessary, a low-pass filter 23 for shutting out high frequencies represented symbolically by the series inductor 23 can be inserted into the electric potential supply lines of this power source. Naturally, the electric potential of this specimen holder 18, being equal to that of the specimen holder electrode 16, which is in turn equal to the electrical potential of the rear surface of the specimen 33, can be continuously measured via the specimen holder electrode terminal 19.

Note that while we will omit the detailed structure of the device used in this preferred embodiment, the vertical position of the specimen holder 18, or in other words, the relative distance from the plasma chamber 11 to the specimen holder 18 which is the same as that to the specimen 33, is adjustable by means of known mechanical contrivances.

Also connected to the gas reaction processing chamber 15 is an exhaust pipe 22 which can induce an appropriate degree of vacuum in this chamber 15 and the plasma chamber 11. In addition, the specimen 33 can be selectively exposed to the plasma gas generated in the plasma chamber 11 by means of selectively opening or closing a rotary shutter 20 situated between the plasma chamber 11 and the specimen holder 18.

An ECR-type gas reaction processing device 10 having this type of structure can be provided with a plasma gas-permeable porous control electrode 30 as a structural component used in the application of this invention. The porous structure of this control electrode, in the case of this preferred embodiment, is satisfied by a mesh structure of braided conducting wire.

This control electrode 30 is supported above the specimen 33 by an insulating support fitting 32 fixed to the specimen holder 18 and, while not shown in detail in the diagram, its height can be changed or adjusted to a certain degree by using known simple mechanical assembly techniques.

An appropriate direct current voltage is applied to the mesh electrode 30 as described hereafter. In the Figure are shown the means required to accomplish this: a terminal 31 which provides electrical connection from the mesh electrode 30 to the outside via an appropriate shielded wire; a pair of positive/negative variable bias power sources 34 as a means of supplying, via this terminal 31, the voltage required to apply the specified direct current voltage to the mesh electrode 30; and the conductive means (conducting line 35 or resistance line 36) for transferring the electric potential of the specimen holder 18 (which is equal to that of the rear surface of the specimen 33). A switch 38 is illustrated to show schematically that it suffices to select one member among the pair of positive/negative variable bias power sources 34, the conducting line 35 and the resistance line 36, according to the circumstances.

Note that a low-pass filter 37 for shutting out high frequencies, represented graphically by the inductance 37, can be inserted, if necessary, into the voltage supply line to this mesh electrode 30, and that the electric potential of the mesh electrode 30 can be measured at any time via the mesh electrode terminal 31.

In order to demonstrate the effectiveness of the present invention in such a device, the following experiments were carried out.

First, for the mesh electrode 30, a mesh of 1 mm diameter stainless steel wire woven with a spacing of 5 mm was prepared, and this was supported at a height of approximately 30 mm above the surface of the specimen holder 18. In addition, the distance from the plasma chamber 11 to the specimen holder 18 was set at 110 mm.

After the interior of the plasma chamber 11 was evacuated to below $5 \times 10^{-7}$ torr, as the gas to be converted to plasma, sulfur hexafluoride ($SF_6$) gas was introduced at approximately 3 cc/minute through the gas inlet pipe 14, the degree of vacuum within the plasma chamber 11 and gas reaction processing chamber 15 was maintained at $1.5 \times 10^{-4}$ torr, while 200 W microwaves were directed into the plasma chamber via the waveguide 12, and the current flowing in the magnet coil 13 was increased until the ECR phenomenon occurred (in the experiment, 16 A was required). Plasma was generated in the plasma chamber 11, and then the rotary shutter 20 was opened and the specimen 33 exposed.

In order to investigate the effects of charged particles accumulated on the surface of specimens in general, the specimen 33 was specially fabricated by thermal oxidation of the surface of a silicon wafer with a surface orientation of (100), conduction type of n-type, and an electrical resistivity of 0.2–0.4 $\Omega$·cm, to form an oxide film with a thickness of approximately 510 nm, and on top of this, an aluminum dot pattern was formed as the surface electrode, resulting in a MOS diode structure.

Due to exposure to the plasma gas generated as described above, charged particles will accumulate on the surface of the experimental specimen 33, resulting in a surface potential. This electric potential was measured by means of a shielded wire, provided specially for this experiment, with one end in contact with the dot pattern surface electrode formed on the surface of the experimental specimen described above and the other end connected to a high input-impedance meter outside of the device.

From the results of this measurement, it was found that the electric potential of the electrode formed on the experimental specimen surface $V_{surface}$ changes in a step-like fashion virtually simultaneously with plasma exposure, quickly settling down to a constant value, and the value upon reaching this steady-state condition is virtually independent of the oxide film thickness as long as the plasma density is constant.

Figure 2:
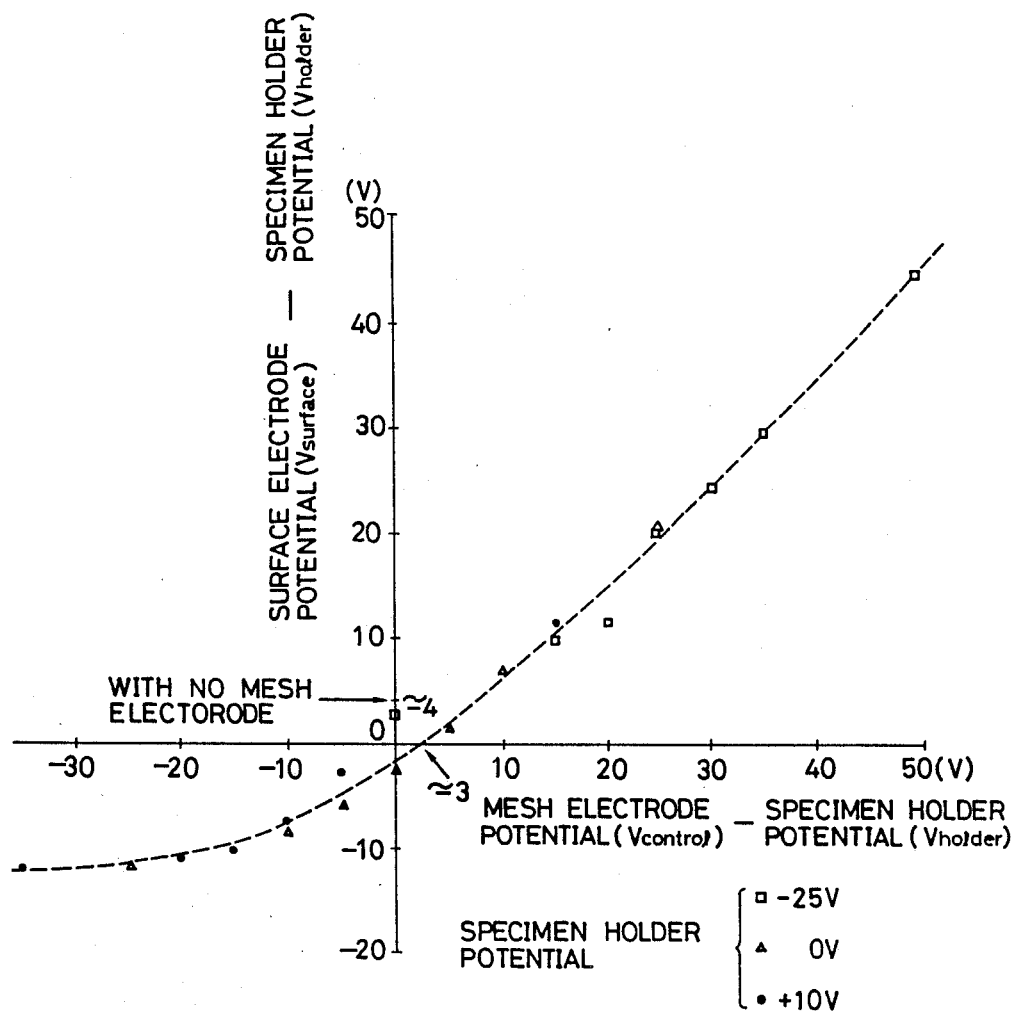
FIG. 2 is a graph illustrating the relationship between the voltage applied to the mesh electrode and the difference in electric potential between the front and rear surfaces of the specimen in the device of FIG. 1.

Yet if the electric potential of the specimen holder $V_{holder}$ supplied from the power source 21 is changed, or if a direct current voltage $V_{control}$ applied from the bias power source 34 to the control electrode (mesh electrode) provided to realize the method of the present invention is changed, this surface potential $V_{surface}$ varies greatly, as shown in FIG. 2.

In FIG. 2, the horizontal axis plots the difference ($V_{control} - V_{holder}$) between the mesh electrode 31 potential $V_{control}$ and the specimen holder 18 potential $V_{holder}$, while the vertical axis plots the difference ($V_{surface} - V_{holder}$) between the experimental specimen surface potential $V_{surface}$ and the specimen holder 18 potential $V_{holder}$ or in other words, the difference in electric potential between the front and rear surfaces of the specimen.

In FIG. 2, with the conventional configuration as is without using the mesh electrode 30, the difference in electric potential ($V_{surface} - V_{holder}$) which occurs between the specimen surface and the holder is approximately +4 V, but as is clear from the results of this experiment, in order to eliminate this difference in electric potential between the front and rear surfaces of the specimen through the application of this invention, when the electric potential of the rear surface of the specimen, which is equal to the specimen holder potential $V_{holder}$, is 0 V, the control voltage $V_{control}$ to be applied to the control electrode should be set to +3 V.

Figure 3A:
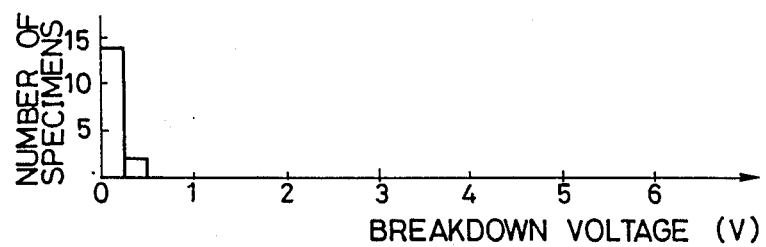
FIGS. 3 (a) and (b) are graphs illustrating the degradation of breakdown voltage of a silicon oxide film due to plasma exposure.
Figure 3B:
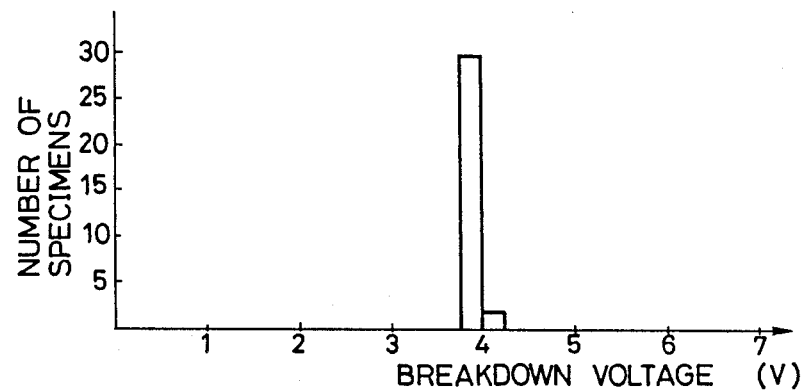

In fact, when a specimen is exposed to plasma in a device which does not apply this invention, there are cases in which the breakdown voltage of the silicon oxide film drops markedly. As an example, an experiment was carried out to test the degradation due to plasma using a specimen with a 30–32 Å-thick silicon oxide film. In the case of FIG. 3(a) in which silicon oxide film is exposed to sulfur hexafluoride (SF$_6$) plasma (oxide film area 8 mm$^2$, electrode area 1.1×10$^4$ $\mu$m$^2$, SF$_6$ 0.15 mtorr, microwave power 400 W), the breakdown voltage distribution is shifted towards the lower voltage in comparison to the case of wet etching of FIG. 3(b).

Yet in cases in which this invention is applied, this was verified to be improved to such a degree that it was virtually no problem.

Figure 4:
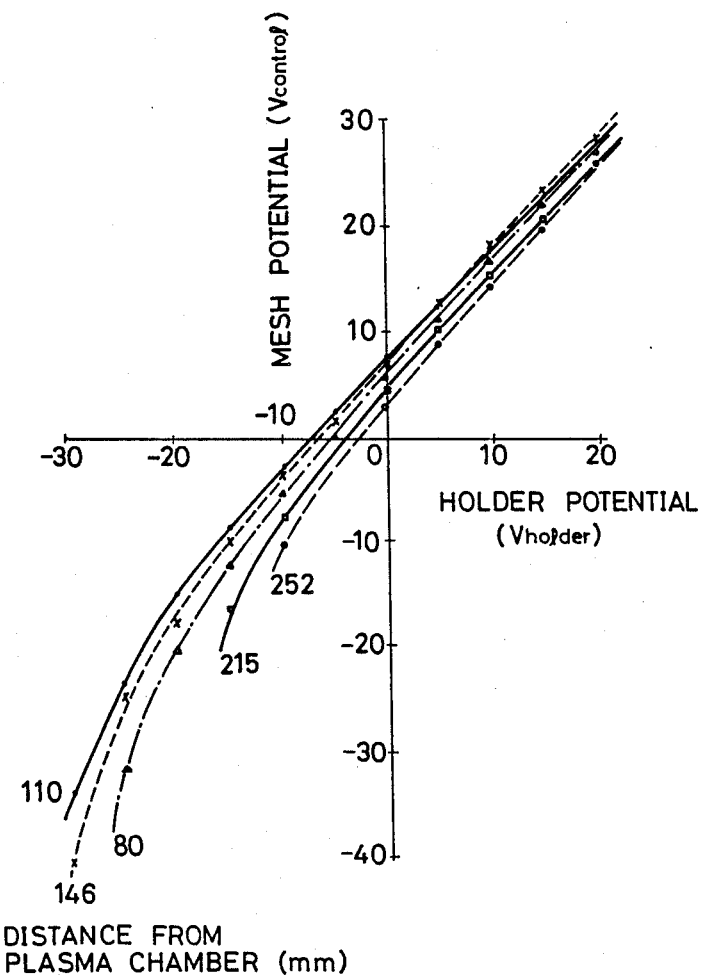
FIG. 4 is a graph illustrating the relationship between the voltage applied to the mesh electrode and the specimen holder voltage.

FIG. 4 is a graph with the distance from the plasma chamber 11 to the specimen holder 18 as a parameter; as this distance is changed in several stages from 110 mm to 252 mm, the combination of specimen holder potential $V_{holder}$ and mesh electrode potential $V_{control}$ necessary to maintain the difference between the specimen surface potential and specimen holder potential ($V_{surface} - V_{holder}$) continuously at zero is plotted. (The numbers below the curves are the distances in millimeters from the plasma chamber to the specimen holder.)

Yet according to this FIG. 4, as opposed to the combination obtained with a distance of 110 mm between the plasma chamber and specimen holder in FIG. 2 above, when the specimen holder potential $V_{holder}$ is 0 V, the mesh electrode potential $V_{control}$ required to bring the difference in electric potential between the front and rear surfaces of the specimen ($V_{surface} - V_{holder}$) to roughly zero was measured to be approximately +8 V.

However this is due to the difference in the relative positions of the experimental specimen surface electrode and the mesh electrode mesh sections at the time of each experiment. If, for example, the mesh is sufficiently fine, the wire comprising the mesh is sufficiently thin, and/or the mesh electrode is further away from the specimen surface, then these values would agree. Of course, the potentials $V_{control}$ and $V_{holder}$ which satisfy FIG. 4 would naturally be different depending on the microwave power, gas pressure, magnetic field strength and other conditions of plasma generation.

Figure 5:
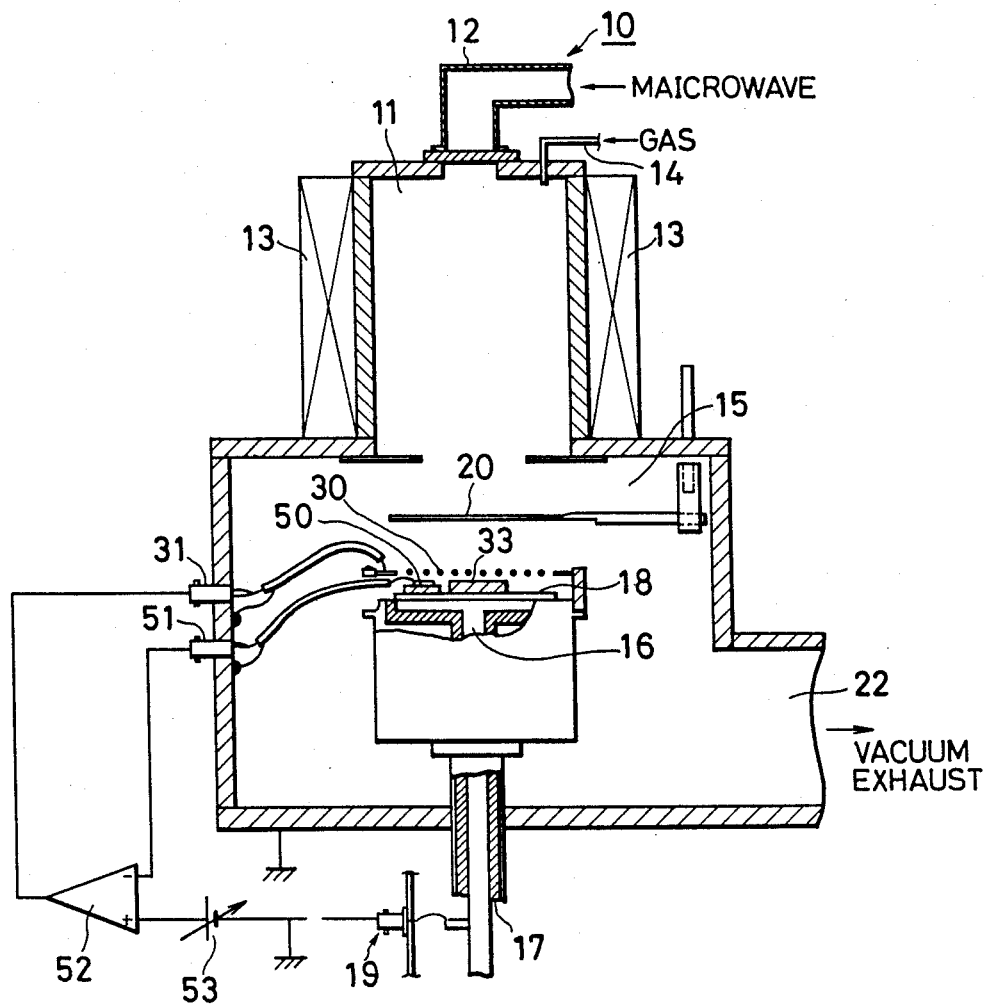
FIG. 5 is a schematic diagram illustrating this invention as applied to a gas reaction processing device having an ECR-type plasma generation section.

In place of the method of applying a direct current voltage to the mesh electrode, there is also the method of applying a feedback voltage. As shown in FIG. 5, a monitoring specimen 50 is placed next to the specimen, and the surface potential of this monitoring specimen is input to the input of an amplifier 52 through a monitoring electrode 51. In the case that specimen holder electrode 16 is floating, the amplifier would be a differential amplifier, and the specimen surface potential and specimen holder 18 potential would be input into this amplifier. Connecting the amplifier output to the mesh electrode 30 forms a feedback loop, whereby the front surface potential of the monitoring specimen 50 is automatically fixed to the rear surface potential, if a direct current voltage source 53 is 0 Volt. As long as the monitoring specimen 50 is placed at a location at which the surface potential of the monitoring specimen 50 is equal to the surface potential of the specimen to the processed 33, the front surface potential of specimen 33 will agree with the rear surface potential, even if the plasma has an instability or noise component such as a power frequency. In addition, there is no need to measure the optimum value of the mesh electrode potential.

In the preferred embodiment described above, while we described exclusively the conditions necessary to bring the difference in electric potential between the front and rear surfaces of the specimen to zero or nearly zero, according to the experimental results, if the difference in electric potential between the front and rear surfaces of the specimen, which had occurred in conventional devices with no modification, is reduced to a level which would cause no problem, even if it is a value which cannot be called nearly zero, there are cases in which the results are as if it was nearly zero.

In the event one wishes intentionally to provide an appropriate difference in electric potential between the front and rear surfaces of the specimen, or to prevent degradation of the specimen to an optimal degree, or if there is another desirable effect, an additional voltage could be applied to the control electrode by the direct current voltage source 53.

Accordingly, as previously explained, bringing the difference in electric potential between the front and rear surfaces of the specimen ($V_{surface} - V_{holder}$) to zero or nearly zero is not an absolute condition for this invention, as it is characterized by allowing unfavorable values to be changed to permissible values.

In addition, when the control electrode potential $V_{control}$ is brought to be nearly equal to the specimen rear-surface potential $V_{holder}$, there are cases in which the specimen front-surface potential $V_{surface}$ also remains within the desirable range. In such cases, if the symbolic switch 38 shown in FIG. 1 is fixed so that it selects the conducting line 35 or resistance line 36, the dedicated bias power source 34 becomes unnecessary, and the method of the present invention can be realized with an inexpensive, simple structure. Of course, in this case, the switch 38 provided for explanation in FIG. 1 becomes unnecessary, so terminals 19 and 31 can be merely connected in short-circuit by the conducting line 35 or resisting line 36. This need not be accomplished outside of the device, but rather the control electrode 30 and the specimen holder electrode can be short-circuited inside the gas reaction processing chamber 15 in advance using conductive wire or conductive tape or other conductive means.

Note that while this was also described previously, the mesh electrode used as the control electrode 30 in the above preferred embodiment may be replaced by another porous structure such as, for example, a plate electrode structure with a pattern of innumerable minute holes or a long, narrow slit pattern. This point is echoed in all the preferred embodiments described below.

Figure 6:
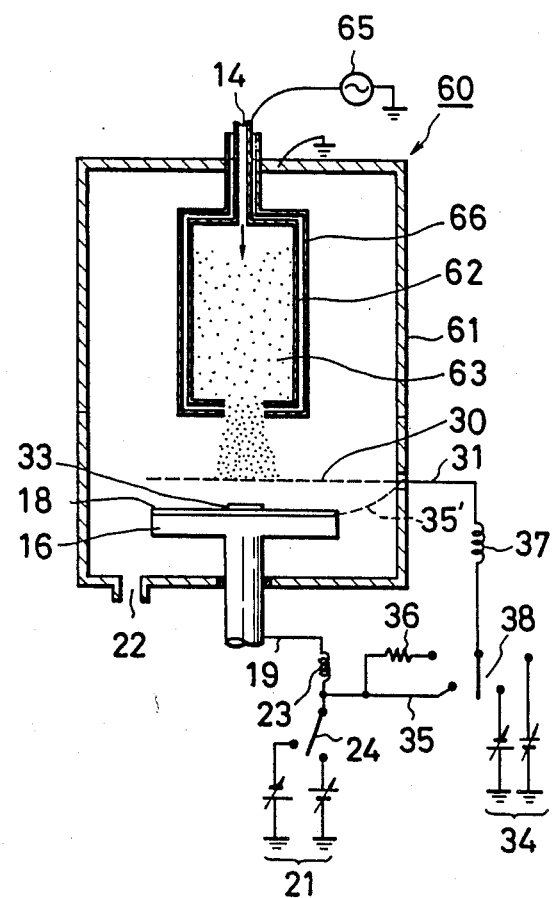
FIG. 6 is a schematic diagram illustrating this invention as applied to a gas reaction processing device having a hollow electrode-type plasma generation section.
Figure 7:
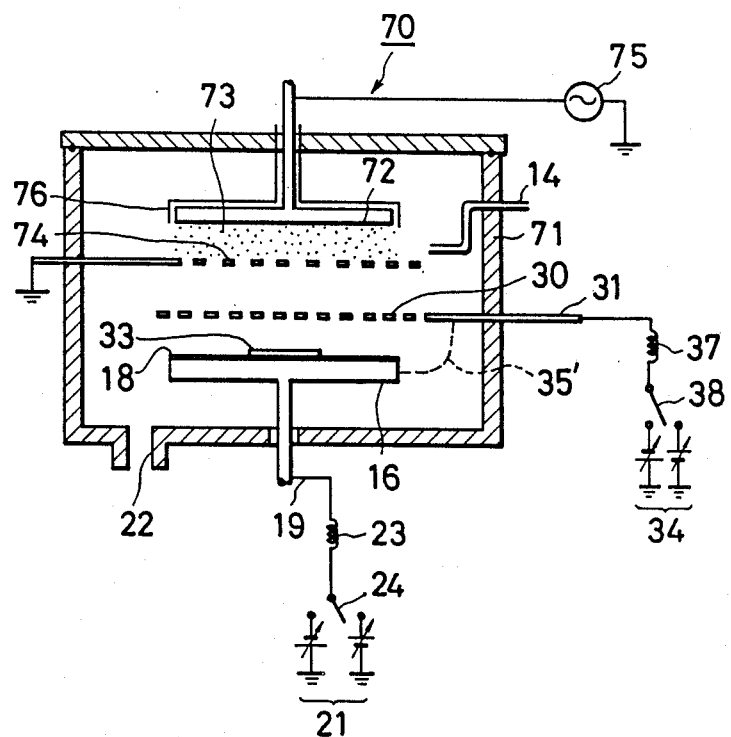
FIG. 7 is a schematic diagram illustrating this invention as applied to a gas reaction processing device having a parallel-plate electrode-type plasma generation section.

FIG. 6 and FIG. 7 show examples of the structures of devices to which this invention has been applied. Therein, the plasma generation section is in a location different than the location at which the specimen is held, and the generated plasma is transported to the location at which the specimen is held. Examples of other devices which carry out etching, oxidation, nitridation and other gas reaction processing, are a gas reaction processing device 60 which has a hollow electrode type plasma generation section (FIG. 6), and a parallel-plate electrode plasma generation-type gas reaction processing device (FIG. 7) which has a parallel-plate electrode type plasma generation section in which the specimen is not supported directly on top of one of these electrodes but rather is supported in a separate location.

First, to describe the hollow electrode plasma generation type gas reaction processing device 60 shown in FIG. 6, enclosed within a vacuum vessel 61 which is brought to an appropriate degree of vacuum via the exhaust pipe 22 and surrounded by a shield 66 is a hollow electrode 62 which is connected to an external high-frequency power source 65.

The top part of the interior of the hollow electrode 62 is used as the gas inlet pipe 14 by which the gas to be converted to plasma is introduced within the hollow electrode 62. Plasma 63 is generated inside this hollow electrode 62 by means of the excitation energy from the high-frequency power source 65. In other words, the space within the hollow electrode 62 forms the plasma generation section, and the plasma gas generated here is released into the vacuum vessel 61 through the holes provided on the bottom of the hollow electrode 62.

Within the vacuum vessel 61 and having a specimen holder electrode 18 is a specimen holder 16, upon which the specimen 33 to be processed is placed. The potential of the specimen holder electrode 16, which is equal to the potential of the rear surface of the specimen to which it is connected, can be set, as in the previous preferred embodiment, to an appropriate value including zero volts by means of one of the pair of power sources 21 which can be selected by the symbolic switch 24.

In addition to the etching of specimens, such a device can also carry out surface oxidation, nitridation and other gas reaction processes. For example, if the gas is oxygen, the surface of the specimen 33 would be oxidized, if nitrogen or ammonia, it would be nitrided. If the specimen surface is polysilicon, silicon oxide film or silicon nitride film, and chlorofluorocarbons or chlorinated gases are selected for the gas, then the specimen would be etched.

Note that when oxidation or nitridation is carried out, the specimen will sometimes be brought to a heated state, and that when etching is carried out, it can be cooled to induce orientation or for other reasons.

Even when such a device as shown in FIG. 6 is used to carry out various types of gas reaction processing, degradation of the specimen surface can be prevented through the application of this invention.

Specifically, a mesh or other type of electrically conductive plasma gas-permeable control electrode 30 described previously is provided at an appropriate height above the specimen 33, or specifically, at an appropriate position in the line of plasma gas transport between the plasma generation section and the location at which the specimen is held. Similarly, as symbolically represented by a switch 38, by selecting either of a negative/positive pair of variable bias power sources 34 or a conductive means (conducting line 35 or resistance line 36) connected to the output of the power source 21 which gives the specimen holder a specified potential $V_{holder}$, a direct current voltage $V_{control}$ can be applied to the control electrode 30 such that it brings the surface potential $V_{surface}$ of the specimen 33 to an appropriate value, effectively preventing the degradation of the specimen surface which had occurred in conventional devices due to the lack of a means of controlling this specimen surface potential.

In addition, in the event that the conducting line 35 described above is used to apply the bias, as described with respect to the device shown previously in FIG. 1, this line need not be mounted on the outside of the device, but rather, as shown as the hypothetical line 35', it can be composed of a short-circuit line provided inside the device.

Next, in FIG. 7, to describe a parallel-plate electrode plasma generation type gas reaction processing device 70 to which this invention has been applied, enclosed within a vacuum vessel 71 which is brought to an appropriate degree of vacuum via the exhaust pipe 22 is a pair of parallel-plate electrodes 72 and 74 between which the gas to be converted to plasma is supplied via the gas inlet pipe 14.

Of the pair of parallel-plate electrodes 72 and 74, the electrode 72, connected typically to the hot side of a high-frequency power source 75 provided on the outside of the vacuum vessel, is a plate electrode with normal shielding 76, while the facing electrode 74 has a porous structure which, in the case shown, allows plasma gas 73 generated in the plasma generation section formed by this pair of electrodes 72 and 74 to permeate in the downward direction.

Thus in the figure, below this porous electrode 74 and having a specimen holder electrode 16 is a specimen holder 18 onto which the specimen to be processed is placed, and its rear surface potential becomes equal to the specimen holder electrode potential.

The potential of this specimen holder electrode, which is equal to the potential of the rear surface of the specimen, as in the examples of devices shown in FIGS. 1 and 6 described previously, can be set to an appropriate value including zero volts by means of one of the negative/positive pair of power sources 21 graphically represented as being selectable by the switch 24.

In this device shown in FIG. 7 also, not only etching of specimens, but also surface oxidation, nitridation and other gas reaction processing can be carried out. For example, if the gas is oxygen, the surface of the specimen 33 would be oxidized, if nitrogen or ammonia, it would be nitrided. If the specimen surface is polysilicon, silicon oxide film or silicon nitride film, and chlorofluorocarbons or chlorinated gases are selected for the gas, then the specimen would be etched. As in the previously examples, when oxidation or nitridation is carried out, the specimen will sometimes be brought to a heated state, and when etching is carried out, it can be cooled to induce orientation or for other reasons.

In addition, in order to apply this invention to such a device, a mesh or other type of electrically conductive plasma gas-permeable control electrode 30 described previously is provided below the porous electrode 74 at an appropriate height above the specimen 33, or specifically, between the pair of parallel-plate electrodes 72 and 74 at the specified position in the line of plasma gas transport between the plasma generation section and the specimen holder 18. Similarly in this drawing also, as symbolically represented by a switch 38, by selecting one of either of a negative/positive pair of variable bias power sources 34 or a conductive means (conducting line 35 or resistance line 36) connected to the output of the power source 21 which gives the specimen holder a specified potential $V_{holder}$, a direct current voltage $V_{control}$ can be applied to the control electrode 30 such that it brings the surface potential $V_{surface}$ of the specimen 33 to an appropriate value, effectively preventing the degradation of the specimen surface which had occurred in conventional devices due to the lack of a means of controlling this specimen surface potential.

The following describes a sample experiment with this device. As the specimen 30, a MIS device was fabricated with amorphous silicon as the top electrode and silicon oxide formed by low-temperature CVD to a thickness of 1000 Å having a relatively low breakdown voltage. In the conventional configuration without providing the control electrode 30 of this invention, when nitrogen fluoride (NF$_3$) was introduced and etching of this experimental specimen carried out, the breakdown voltage of the silicon oxide insulating film decreased and the capacitance through the silicon oxide insulating film as a function of voltage became unstable.

In contrast, when this invention was applied through an appropriate voltage being applied across the control electrode 30 and the specimen holder electrode 16 while the etching is carried out, no such instability was evident.

The voltage at this time, specifically the optimum bias potential $V_{control}$ provided to the specimen holder electrode 16, was found experimentally in each case depending on the conditions. For example, when the degree of vacuum was approximately 1 torr within the vacuum vessel 51 into which NF$_3$ gas is introduced, bringing the control electrode potential $V_{control}$ to be roughly equal to the specimen holder potential $V_{holder}$ was demonstrated to be sufficiently effective in preventing degradation.

Therefore, in such a case, even without using the dedicated bias power source 34, it is sufficient to connect the specimen holder electrode 16 and the control electrode 30 using the conducting line 35 or resistance line 36, and this may be carried out either outside of the vacuum vessel 71 or as shown by the hypothetical line 35' in FIG. 7, by conductive line, conductive tape or other appropriate conductive means.

What is claimed is:

1. A method of gas reaction process control wherein plasma gas generated in a location different from a location at which a specimen with a front surface and a rear surface is held is transported to said location at which said specimen is held and gas reaction processing of said specimen is carried out, the improved method comprising the steps of:

providing a control electrode with a porous structure permeable to said plasma gas in said transportation route;

measuring a surface potential difference between the front surface and the rear surface of said specimen;

applying a control voltage to said control electrode; and adjusting said surface potential difference to a predetermined value.

2. A method according to claim 1 wherein said plasma gas includes a gas containing radicals and at least one of dissociated ions and electrons.

3. A method according to claim 1 further comprising the steps of holding a monitoring specimen with a front surface and a rear surface at said location at which said specimen is held, measuring a potential difference between the front surface and rear surface of said monitoring specimen, applying a control voltage to said control electrode, and adjusting said surface potential difference to a predetermined value.

4. A method according to claim 3 wherein said plasma gas includes a gas containing radicals and at least one of dissociated ions and electrons.

5. A method according to claim 3 wherein said voltage applied to said control electrode is of such a value that any difference in electrical potential between the front surface and rear surface of said monitoring specimen becomes zero.

6. A method according to claim 8 wherein said control electrode has a mesh structure.

7. A method according to claim 3, further comprising the steps of connecting an amplifier to said control electrode for amplifying a difference between the front surface and the rear surface of said monitoring specimen, and supplying an output of said amplifier to said control electrode.

8. A method according to claim 1 wherein said voltage applied to said control electrode is of such value that any difference in electrical potential between the front surface and rear surface of said specimen becomes zero.

9. A method according to claim 1 wherein said control electrode has a mesh structure.

* * * * *